US010748974B2

(12) United States Patent
Lee et al.

(10) Patent No.: US 10,748,974 B2
(45) Date of Patent: Aug. 18, 2020

(54) DISPLAY APPARATUS

(71) Applicant: SAMSUNG DISPLAY CO., LTD., Yongin-si, Gyeonggi-do (KR)

(72) Inventors: Hyoungsub Lee, Yongin-si (KR); Wooyong Sung, Yongin-si (KR); Junghan Seo, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/386,695

(22) Filed: Apr. 17, 2019

(65) Prior Publication Data

US 2020/0052051 A1 Feb. 13, 2020

(30) Foreign Application Priority Data

Aug. 9, 2018 (KR) ........................ 10-2018-0093143

(51) Int. Cl.

| | |
|---|---|
| ***H01L 27/32*** | (2006.01) |
| ***H01L 51/52*** | (2006.01) |
| ***H01L 27/12*** | (2006.01) |
| ***G06F 1/16*** | (2006.01) |

(52) U.S. Cl.

CPC ........ *H01L 27/3246* (2013.01); *G06F 1/1626* (2013.01); *H01L 27/1218* (2013.01); *H01L 51/5203* (2013.01); *H01L 51/5237* (2013.01)

(58) Field of Classification Search

CPC ............... H01L 51/5237; H01L 51/524; H01L 51/5243; H01L 51/5246; H01L 51/525; H01L 27/76205; H01L 27/76208

See application file for complete search history.

(56) References Cited

U.S. PATENT DOCUMENTS

| | | | | |
|---|---|---|---|---|
| 2017/0162111 | A1 | 6/2017 | Kang et al. | |
| 2017/0162637 | A1 | 6/2017 | Choi et al. | |
| 2017/0237037 | A1* | 8/2017 | Choi | H01L 51/56 257/40 |
| 2017/0237038 | A1 | 8/2017 | Kim et al. | |
| 2017/0287992 | A1* | 10/2017 | Kwak | H04M 1/0264 |
| 2018/0090722 | A1 | 3/2018 | Kim et al. | |
| 2019/0245159 | A1* | 8/2019 | Kim | H01L 27/3244 |
| 2019/0334120 | A1* | 10/2019 | Seo | H01L 27/323 |
| 2019/0355930 | A1* | 11/2019 | Lee | H01L 27/3246 |

(Continued)

FOREIGN PATENT DOCUMENTS

| | | |
|---|---|---|
| KR | 10-2017-0065059 | 6/2017 |
| KR | 10-2017-0066767 | 6/2017 |
| KR | 10-2018-0034746 | 4/2018 |

*Primary Examiner* — Dong Hui Liang

(74) *Attorney, Agent, or Firm* — F. Chau & Associates, LLC

(57) ABSTRACT

A display apparatus includes a thin film transistor disposed in a display area of a substrate and a display device in the display area that is electrically connected to the thin film transistor, an encapsulation layer that protects the display device, at least one through portion formed in the display area that vertically penetrates the substrate and a plurality of layers stacked on the substrate, and a first groove and a second groove that are spaced apart from each other and that surround the at least one through portion. A flow-restriction portion is disposed in a region between the first groove and the second groove that protrudes upwards from the substrate and confines an organic encapsulation layer of the encapsulation layer.

20 Claims, 7 Drawing Sheets

(56) References Cited

U.S. PATENT DOCUMENTS

2020/0006700 A1* 1/2020 Kim .................... H01L 27/3227
2020/0006701 A1* 1/2020 Lee ..................... H01L 51/0096
2020/0052054 A1* 2/2020 Park .................... H01L 27/3225
2020/0083475 A1* 3/2020 Kang .................. H01L 51/5221

* cited by examiner 100
104
103
102
101
100a
II'
650
630''
630'
630
610
613
611
620
500
510
520
530
421
420
140a
170a
160a
140
160
140b
330
130
150
170
120
I' II
170
130
160
120
140
150
217
330
300
320
213
211
210
310
215
500
530
520
510
I
x
z

DISPLAY APPARATUS

CROSS-REFERENCE TO RELATED PATENT APP CATION

This application claims priority under 35 U.S.C. § 119 from, and the benefit of, Korean Patent Application No. 10-2018-0093143, filed on Aug. 9, 2018 in the Korean Intellectual Property Office, the contents of which are herein incorporated by reference in their entirety.

BACKGROUND

1. Technical Field

One or more embodiments are directed to a display apparatus.

2. Discussion of the Related Art

Recently, on the front surface of display apparatuses, a display area for displaying images has increased in size while physical buttons have been removed. For example, display apparatuses have been introduced in which a separate member, such as a camera that increases functionality of a display apparatus, is disposed in a display area to minimize a decrease in the size of the display area. To dispose a separate member, such as a camera, in the display area, a groove or a through portion where the separate member is located needs to be formed in the display area. However, the groove or through portion in the display area may provide a new moisture infiltration path through which external moisture infiltrates into the display area.

SUMMARY

One or more embodiments include display apparatuses that can prevent infiltration of external moisture or other contaminants through a through portion in a display area.

According to one or more embodiments, a display apparatus includes a substrate having a display area and a peripheral area outside the display area; a thin film transistor disposed in the display area of the substrate; a display device electrically disposed in the display area that is connected to the thin film transistor; an encapsulation layer that protects the display device; at least one through portion formed in the display area and that vertically penetrates the substrate and a plurality of layers stacked on the substrate; and a first groove and a second groove that are spaced apart from each other and that surround the at least one through portion. The encapsulation layer includes a first inorganic encapsulation layer, an organic encapsulation layer, and a second inorganic encapsulation layer sequentially stacked on each other. The first groove and the second groove partition a non-display area between the at least one through portion and the display area into a first region between the display area and the second groove, a second region between the first groove and the second groove, and a third region between the first groove and the at least one through portion. A flow-restriction portion is disposed in the second region that protrudes upwards from the substrate to confine the organic encapsulation layer.

The thin film transistor may include a semiconductor layer, a gate electrode, a source electrode, and a drain electrode, and the plurality of layers may include a gate insulating layer disposed between the semiconductor layer and the gate electrode, an interlayer insulating layer between the gate electrode and the source and drain electrodes, a planarization layer disposed on the thin film transistor, and a pixel defining layer disposed on the planarization layer and that exposes a center portion of a pixel electrode of the display device. The plurality of layers may be disposed within the first region and the third region.

The flow-restriction portion may include a same material as a material included in at least one of the planarization layer and the pixel defining layer.

The display apparatus may further comprise a first detection portion disposed on the pixel defining layer in the third region that protrudes upwards from an upper surface of the pixel defining layer.

The display apparatus may further comprise a second detection portion formed in an upper surface of the pixel defining layer in the third region. The second detection portion may have a concave shape indented in a thickness direction of the pixel defining layer.

The display apparatus may further comprise a third detection portion disposed on the pixel defining layer in the first region that protrudes upwards from an upper surface of the pixel defining layer.

The display apparatus may further comprise a stepped portion formed in an end of the pixel defining layer in the first region that lowers a height of the pixel defining layer, and a fourth detection portion disposed on the stepped portion that protrudes upwards from the pixel defining layer.

The gate insulating layer and the interlayer insulating layer may be disposed in the second region between the substrate and the flow-restriction portion.

The organic encapsulation layer may fill an inside of the second groove, and the first inorganic encapsulation layer and the second inorganic encapsulation layer may contact each other in the first groove.

The substrate may include a first base layer, a first barrier layer, a second base layer, and a second barrier layer sequentially stacked on each other. Each of the first groove and the second groove may extend from the second barrier layer into a portion of the second base layer. A width of an upper portion of the first groove may be less than a width of the inside of the first groove, and a width of an upper portion of the second groove may be less than a width of an inside of the second groove.

According to one or more embodiments, a display apparatus includes a display area and a peripheral area outside the display area; a substrate that includes a first base layer, a first barrier layer, a second base layer, and a second barrier layer sequentially stacked on each other; a display device disposed on the second barrier layer in the display area; an encapsulation layer disposed on the display device and that protects the display device and extends from the display area into the peripheral area; a through portion formed in the display area that penetrates the display device in a thickness direction of the display device; a first groove that surrounds the through portion at a position spaced apart from the through portion; a second groove spaced apart from the first groove and that surrounds the first groove; and a flow-restriction portion disposed between the first groove and the second groove that protrudes upwards from the substrate. Each of the first groove and the second groove penetrates from the second barrier layer into a portion of the second base layer, and the second groove is filled by an organic encapsulation layer of the encapsulation layer.

The encapsulation layer may further include a first inorganic encapsulation layer and a second inorganic encapsulation layer respectively disposed on a lower surface and an upper surface of the organic encapsulation layer, and the first inorganic encapsulation layer and the second inorganic encapsulation layer may contact each other in the first groove.

The display device may include a pixel electrode, an opposite electrode, and an intermediate layer between the pixel electrode and the opposite electrode and that includes an emission layer. The display apparatus may further include a thin film transistor electrically connected to the pixel electrode, a planarization layer disposed between the thin film transistor and the display device, and a pixel defining layer disposed on the planarization layer and that exposes a center portion of the pixel electrode. The planarization layer and the pixel defining layer may be disposed in a region between the through portion and the first groove and also in a region between the second groove and the display area.

The flow-restriction portion may include a same material as a material included in at least one of the planarization layer and the pixel defining layer.

The display device may further include a first detection portion disposed on the pixel defining layer in the region between the through portion and the first groove, wherein first detection portion protrudes upwards from an upper surface of the pixel defining layer.

The display device may further include a second detection portion formed on an upper surface of the pixel defining layer in the region between the through portion and the first groove, wherein the second detection portion has a concave shape indented in a thickness direction of the pixel defining layer.

The display device may further include a third detection portion disposed on the pixel defining layer in the region between the second groove and the display area, wherein the third detection portion protrudes upwards from an upper surface of the pixel defining layer.

The display device may further include a stepped portion formed at an end of the pixel defining layer in the region between the second groove and the display area, wherein the stepped portion lowers a height of the pixel defining layer, and a fourth detection portion disposed on the stepped portion and that protrudes upwards from the pixel defining layer.

The second barrier layer may include a pair of cantilever shaped first tips that face each other in an upper end portion of the first groove, and a pair of cantilever shaped second tips that face each other in an upper end portion of the second groove.

According to one or more embodiments, a display apparatus includes a substrate that includes a first base layer, a first barrier layer, a second base layer, and a second barrier layer sequentially stacked on each other, wherein the substrate includes a display area and a peripheral area outside the display area; an encapsulation layer disposed on the substrate that extends from the display area into the peripheral area, wherein the encapsulation layer includes a first inorganic encapsulation layer, an organic encapsulation layer, and a second inorganic encapsulation layer sequentially stacked on each other; a through portion formed in the display area of the substrate that penetrates the substrate in a thickness direction of the substrate; a first groove that surrounds the through portion at a position spaced apart from the through portion; a second groove spaced apart from the first groove and that surrounds the first groove; and a flow-restriction portion disposed between the first groove and the second groove that protrudes upwards from the substrate. Each of the first groove and the second groove penetrates the second barrier layer into a portion of the second base layer, the first inorganic encapsulation layer and the second inorganic encapsulation layer contact each other in the first groove, and the second groove is filled by the organic encapsulation layer.

DETAILED DESCRIPTION

Figure 1:
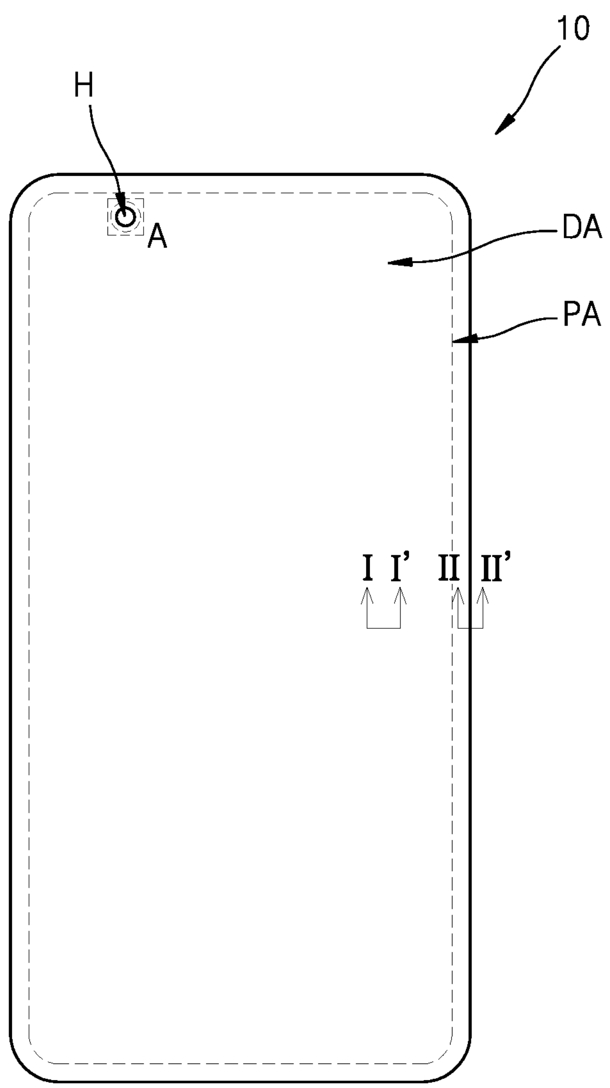
FIG. 1 is a schematic plan view of a display apparatus according to an embodiment.

Hereinafter, effects and features of embodiments of the present disclosure and a method for accomplishing them will be described more fully with reference to the accompanying drawings, in which embodiments of the disclosure are shown. This disclosure may, however, be embodied in many different forms and should not be construed as limited to the embodiments set forth herein.

It will be understood that when a layer, region, or component is referred to as being "formed on" another layer, region, or component, it can be directly or indirectly formed on the other layer, region, or component.

Sizes of elements in the drawings may be exaggerated for convenience of explanation.

Exemplary embodiments of the disclosure will be described below in more detail with reference to the accompanying drawings. Those components that are the same or are in correspondence may have the same reference numeral regardless of the figure number.

Figure 2:
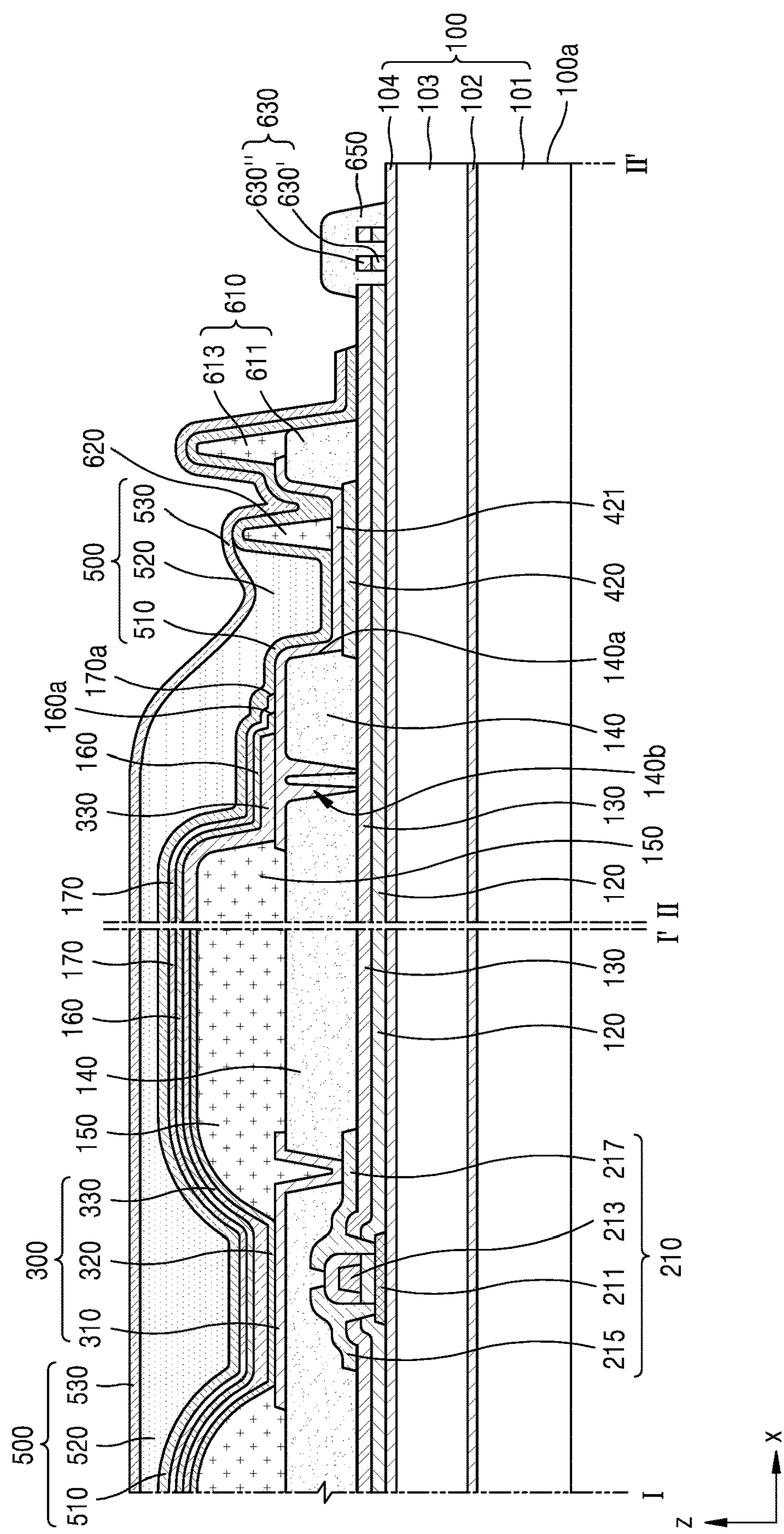
FIG. 2 is a cross-sectional view taken along lines I-If and of FIG. 1, according to an embodiment.

FIG. 1 is a schematic plan view of a display apparatus 10 according to an embodiment. FIG. 2 is a cross-sectional view taken along lines l- and of FIG. 1, according to an embodiment.

Referring to FIGS. 1 and 2, according to an embodiment, the display apparatus 10 includes a substrate 100 that has a display area DA where an image is displayed, and a peripheral area PA located outside the display area DA.

According to an embodiment, a display device is located in the display area DA, and the peripheral area PA includes a pad area in which various electronic devices or a printed circuit board (PCB) are electrically attached.

According to an embodiment, a thin film transistor (TFT) 210 to which the display device is electrically connected is located in the display area DA, in addition to the display device. In FIG. 2, the display device in the display area DA is an organic light-emitting device (OLED) 300. The OLED 300 is electrically connected to the TFT 210 and includes a pixel electrode 310 electrically connected to the TFT 210.

According to an embodiment, at least one through portion H is located in the display area DA. The through portion H penetrates the display apparatus 10 in a thickness direction of the display apparatus 10. The through portion H is a space for accommodating a special member of the display apparatus 10 or a member that adds a new function to the display apparatus 10. For example, a plurality of through portions H can be formed in the display area DA, and a sensor, a light source or a camera module can be located in each through portion H.

According to an embodiment, since the through portion H penetrates the substrate 100 and a plurality of layers stacked on the substrate 100, external moisture or oxygen can infiltrate into the display apparatus 10 through sections of the display apparatus 10 that are exposed by the through portion H. However, according to an embodiment, a plurality of grooves that surround the through portion H are formed, thereby effectively preventing the infiltration of moisture. The through portion H will be described in detail below with reference to FIG. 3. In the following description, a configuration of the display apparatus 10 is described first with reference to FIG. 2.

According to an embodiment, the substrate 100 includes various materials. For a bottom-emission display apparatus that displays an image toward the substrate 100, the substrate 100 includes a transparent material. However, for a top-emission display apparatus that displays an image away from the substrate 100, the substrate 100 does not need to include a transparent material. In this case, the substrate 100 includes a metal. The metal in the substrate 100 is at least one of iron (Fe), chrome (Cr), manganese (Mn), nickel (Ni), titanium (Ti), molybdenum (Mo), stainless steel (SUS), an Invar alloy, an Inconel alloy, or a Kovar alloy.

For example, according to an embodiment, the substrate 100 has a multi-layered structure in which a first base layer 101, a first barrier layer 102, a second base layer 103, and a second barrier layer 104 are sequentially stacked.

According to an embodiment, the first base layer 101 and the second base layer 103 include, for example, a transparent glass material that contains $SiO_2$ as a main component. However, the materials included in the first and second base layers 101 and 103 are not limited thereto, and the first base layer 101 and the second base layer 103 can include a transparent plastic material. The plastic material can be polyethersulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), or cellulose acetate propionate (CAP).

According to an embodiment, the first base layer 101 and the second base layer 103 may have the same or different thicknesses. For example, each of the first base layer 101 and the second base layer 103 includes polyimide and has a thickness from about 3 μm to about 20 μm.

According to an embodiment, each of the first and second barrier layers 102 and 104 prevents infiltration of external foreign materials into the display apparatus 10 through the substrate 100, and may have a single layer or multiple layers that include an inorganic material, such as SiNx and/or SiOx. For example, the first barrier layer 102 is a multi-layer that includes an amorphous silicon layer and a silicon oxide layer to improve adhesion between neighboring layers, and the second barrier layer 104 may be a silicon oxide layer. Each of the first barrier layer 102 and the second barrier layer 104 has a thickness from about 4000 Å to about 7000 Å, but embodiments of the present disclosure are not limited thereto.

According to an embodiment, a buffer layer is further formed on the substrate 100. The buffer layer planarizes an upper surface of the substrate 100 and block foreign matter or moisture from infiltrating through the substrate 100. For example, the buffer layer may include an inorganic material, such as silicon oxide, silicon nitride, silicon oxynitride, aluminum oxide, aluminum nitride, titanium oxide, or titanium nitride, or an organic material, such as polyimide, polyester, or acryl, or may be formed as stacks of these materials. According to some embodiments, the second barrier layer 104 of the substrate 100 is a portion of a multi-layered buffer layer.

According to an embodiment, the display area DA of the substrate 100 includes the TFT 210 and further includes the display device electrically connected to the TFT 210. FIG. 2 illustrates OLED 300 as an exemplary display device. A TFT may be disposed on the peripheral area PA of the substrate 100. The TFT in the peripheral area PA is a portion of a circuit unit that control electrical signals transmitted to the display area DA.

According to an embodiment, the TFT 210 includes a semiconductor layer 211 that includes amorphous silicon, polycrystalline silicon, or an organic semiconductor material, a gate electrode 213, a source electrode 215, and a drain electrode 217. When the buffer layer is disposed on the substrate 100, the semiconductor layer 211 is disposed on the buffer layer.

According to an embodiment, the gate electrode 213 is disposed on the semiconductor layer 211, and the source electrode 215 and the drain electrode 217 will electrically connect to each other in response to a signal received by the gate electrode 213. The gate electrode 213 includes at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper (Cu), and may have a single-layered or multi-layered structure. To insulate the semiconductor layer 211 from the gate electrode 213, a gate insulating layer 120 that includes an inorganic material, such as silicon oxide, silicon nitride, or silicon oxynitride, is interposed between the semiconductor layer 211 and the gate electrode 213.

According to an embodiment, an interlayer insulating layer 130 is disposed on the gate electrode 213 and includes an inorganic material, such as silicon oxide, silicon nitride, or silicon oxynitride, and may have a single-layered or multi-layered structure.

According to an embodiment, the source electrode 215 and the drain electrode 217 are disposed on the interlayer insulation layer 130. The source electrode 215 and the drain electrode 217 are electrically connected to the semiconductor layer 211 via contact holes formed in the interlayer insulation layer 130 and the gate insulating layer 120. The source electrode 215 and the drain electrode 217 include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), and may have a single-layered or multi-layered structure, based on considerations of conductivity, etc.

According to an embodiment, a protection layer is disposed on the TFT 210 to protect the TFT 210. The protection layer includes an inorganic material, such as silicon oxide, silicon nitride, or silicon oxynitride. The protection layer may have a single layer or a stack of multiple layers.

According to an embodiment, a planarization layer 140 is disposed on the TFT 210. For example, when the OLED 300 is located above the TFT 210 as illustrated in FIG. 2, the planarization layer 140 covers the TFT 210 and planarize unevenness due to, the TFT 210. The planarization layer 140 includes an organic material, such as, acryl, berizocyclobutene (BCB) or hexamethyldisiloxane (HMDSO). Although the planarization layer 140 is shown as a single layer in FIG. 2, embodiments are not limited thereto. For example, the planarization layer 140 may be a stack of multiple layers. The display apparatus 10 according to a present embodiment may include both the protection layer and the planarization layer 140. In other embodiments, the display apparatus 10 includes only the planarization layer 140.

According to an embodiment, the OLED 300 is disposed on the planarization layer 140 within the display area DA of the substrate 100. The OLED 300 includes the pixel electrode 310, an opposite electrode 330, and an intermediate layer 320 between the pixel electrode 310 and the opposite electrode 330 and that includes an emission layer.

According to an embodiment, an opening formed in the planarization layer 140 exposes at least one of the source electrode 215 and the drain electrode 217 of the TFT 210, and the pixel electrode 310 is electrically connected to the source electrode 215 or the drain electrode 217 of the TFT 210 via the opening in the planarization layer 140.

According to an embodiment, the pixel electrode 310 may be a transparent or semi-transparent electrode or a reflective electrode. When the pixel electrode 310 is a transparent or semi-transparent electrode, the pixel electrode 310 includes, for example, at least one of indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 310 is a reflective electrode, the pixel electrode 310 includes a reflective layer that includes at least one of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer including at least one of ITO, IZO, ZnO, $In_2O_3$, IGO, or AZO. However, embodiments of the present disclosure are not limited thereto, and the pixel electrode 310 may include any of various other materials and may have any of various structures, such as, a single-layered or multi-layered structure.

According to an embodiment, a pixel defining layer 150 is disposed over the planarization layer 140. The pixel defining layer 150 has an opening that defines a pixel by exposing at least a center portion of the pixel electrode 310. In an embodiment illustrated in FIG. 2, the pixel defining layer 150 covers an edge of the pixel electrode 310, which increases a distance between the edge of the pixel electrode 310 and the opposite electrode 330 disposed over the pixel electrode 310 to prevent an arc from occurring on the edge of the pixel electrode 310. The pixel defining layer 150 includes an organic material, such as polyimide or HMDSO.

According to an embodiment, the intermediate layer 320 of the OLED 300 includes the emission layer. The emission layer may include a low molecular weight or high molecular weight organic material that emits light of a predetermined. The intermediate layer 320 further includes, in addition to the emission layer, at least one functional layer selected from a hole transport layer (HTL), a hole injection layer (HIL), an electron transport layer (ETL), and an electron injection layer (EIL). Such functional layers include an organic material. Some of the plurality of layers that constitute the intermediate layer 20 such as the functional layer(s), integrally extend over a plurality of OLEDs 300.

According to an embodiment, the opposite electrode 330 is disposed to cover the display area DA. The opposite electrode 330 is formed as a single body constituting a plurality of OLEDs 300, and thus corresponds to the plurality of pixel electrodes 310. The opposite electrode 330 may be a transparent or semi-transparent electrode or a reflective electrode. When the opposite electrode 330 is a transparent or semi-transparent electrode, the opposite electrode 330 has a metallic layer that has a small work function, such as Li, Ca, LiF/Ca, LiF/Al, Al, Ag, Mg, or a compound thereof, and a transparent or semi-transparent conductive layer that includes at least one of, e.g., ITO, IZO, ZnO, or $In_2O_3$. When the opposite electrode 330 is a reflective electrode, the opposite electrode 330 has a layer that includes at least one of Li, Ca, LiF/Ca, LiF/Al, Al, Ag, Mg, or a compound thereof. The configuration of the opposite electrode 330 and the materials included in the opposite electrode 330 are not limited to those described above, and in other embodiments, various modifications may be made to the opposite electrode 330.

According to an embodiment, a preset electrical signal is transmitted to the opposite electrode 330 so that the display apparatus 10 can display an image. To this end, a voltage line 420 is disposed in the peripheral area PA that transmits the preset electrical signal to the opposite electrode 330. The voltage line 420 is a common power supply voltage (ELVSS).

According to an embodiment, the voltage line 420 is formed simultaneously when various conductive layers are formed in the display area DA, and is formed using the same material as that used to form the conductive layers. In FIG. 2, the voltage line 420 is disposed on the interlayer insulating layer 130 in the peripheral area PA. In this case, the voltage line 420 is formed simultaneously on the interlayer insulating layer 130 with the forming of the source electrode 215 and the drain electrode 217 using the same material as that used to form the source electrode 215 and the drain electrode 217. Accordingly, the voltage line 420 has the same, structure as the source electrode 215 and the drain electrode 217. However, embodiments of the present disclosure are not limited thereto, and various modifications may be made to the voltage line 420. For example, the voltage line 420 may be formed simultaneously with the gate electrode 213 using the same material as that used to form the gate electrode 213 on the gate insulating layer 120.

According to an embodiment, the opposite electrode 330 may directly contacts the voltage line 420, or, as shown in FIG. 2, may be electrically connected to the voltage line 420 via a protection conductive layer 421. The protection conductive layer 421 is disposed on the planarization layer 140, and extends over the voltage line 420 to be electrically connected to the voltage line 420. Accordingly, the opposite electrode 330 contacts the protection conductive layer 421 in the peripheral area PA, and the protection conductive layer 421 contacts the voltage line 420 in the peripheral area PA.

According to an embodiment, because the protection conductive layer 421 is disposed on the planarization layer 140 as shown in FIG. 2, the protection conductive layer 421 is simultaneously formed with components formed on the planarization layer 140 within the display area DA using the same material as that used to form the components on the planarization layer 140. In detail, the protection conductive layer 421 is simultaneously formed on the planarization layer 140 in the peripheral area PA with the pixel electrode 310 within the display area DA using the same material as that used to form the pixel electrode 310. Accordingly, the protection conductive layer 421 has the same structure as the pixel electrode 310. As shown in FIG. 2, the protection conductive layer 421 covers a portion of the voltage line 420 that is, exposed by the planarization layer 140. Accordingly, the exposed portion of the voltage line 420 can be prevented from being damaged while forming a first confining dam 610 or a second confining dam 620.

According to an embodiment, to prevent impurities, such as oxygen or moisture, from permeating into the display area DA via the planarization layer 140, the planarization layer 140 has an opening 140*b* within the peripheral area PA, as shown in FIG. 2. The opening 140*b* surrounds the display area DA. When the protection conductive layer 421 is formed, the protection conductive layer 421 fills the opening 140*b*. Accordingly, impurities that would otherwise infiltrate into the planarization layer 140 within the peripheral area PA can be effectively prevented from doing so.

According to an embodiment, a capping layer 160 that improves efficiency of the light emitted by the OLEO 300 is disposed on the opposite electrode 330. The capping layer 160 covers the opposite electrode 330, and extends beyond the opposite electrode 330 in the peripheral area PA to contact the protection conductive layer 421. Because the opposite electrode 330 covers the display area DA and extends into the peripheral area PA, the capping layer 160 also covers the display area DA and extends into the peripheral area PA. The capping layer 160 includes an organic material.

As described above, according to an embodiment, the capping layer 160 improves efficiency of the light emitted by the OLED 300. For example, the capping layer 160 improves efficiency of light extraction out of the display apparatus 10. The efficiency improvement of the capping layer 160 is uniformly achieved over the display area DA. Considering this, the capping layer 160 has an upper surface that conforms to the unevenness of an upper surface of a layer therebelow. In other words, as shown in FIG. 2, an upper surface of a portion of the capping layer 160 that is on the opposite electrode 330 has a shape that corresponds to a shape of the upper surface of the opposite electrode 330.

According to an embodiment, an encapsulation layer 500 is disposed on the capping layer 160. The encapsulation layer 500 protects the OLED 300 from external moisture or oxygen. To this end, the encapsulation layer 500 extends over the entire display area DA, in which the OLED 300 is disposed, and into the peripheral area PA. The encapsulation layer 500 has a multi-layered structure. In detail, as shown in FIG. 2, the encapsulation layer 500 includes a first inorganic encapsulation layer 510, an organic encapsulation layer 520, and a second inorganic encapsulation layer 530.

According to an embodiment, the first inorganic encapsulation layer 510 covers the capping layer 160 and includes at least one of silicon oxide, silicon nitride, or silicon oxynitride. Because the first inorganic encapsulation layer 510 is formed on structures therebelow, the upper surface thereof is not flat, as shown in FIG. 2.

According to an embodiment, the organic encapsulation layer 520 covers the first inorganic encapsulation layer 510 and has a thickness sufficient to provide an substantially flat upper surface over the entire display area DA. The organic encapsulation layer 520 includes at least one material selected from polyethylene terephthalate, polyethylene naphthalate, polycarbonate, polyimide, polyethylene sulfonate, polyoxymethylene, polyarylate, or hexamethyldisiloxane.

According to an embodiment, the second inorganic encapsulation layer 530 covers the organic encapsulation layer 520 and includes at least one of silicon oxide, silicon nitride, or silicon oxynitride. The second inorganic encapsulation layer 530 extends beyond the organic encapsulation layer 520 in the peripheral area PA and contacts the first inorganic encapsulation layer 510 such that the organic encapsulation layer 520 is not externally exposed.

As such, according to an embodiment, since the encapsulation layer 500 includes the first inorganic encapsulation layer 510, the organic encapsulation layer 520, and the second inorganic encapsulation layer 530, even when the encapsulation layer 500 cracks, due to this multi-layered structure, this crack may not connect the first inorganic encapsulation layer 510 and the organic encapsulation layer 520 or the organic encapsulation layer 520 and the second inorganic encapsulation layer 530. Accordingly, the formation of paths via which external moisture, oxygen, etc., can permeate into the display area DA can be prevented or minimized.

According to an embodiment, while the encapsulation layer 500 is being formed, structures below the encapsulation layer 500 can be damaged. For example, the first inorganic encapsulation layer 510 can be formed via chemical vapor deposition. When the first inorganic encapsulation layer 510 is formed via chemical vapor deposition, a layer directly therebelow can be damaged. Accordingly, when the first inorganic encapsulation layer 510 is directly formed on the capping layer 160, the capping layer 160 can be damaged, and the luminescent efficiency of the display apparatus 10 can be reduced. Accordingly, to prevent damage to the capping layer 160 while the encapsulation layer 500 is being formed, a protection layer 170 is interposed between the capping layer 160 and the encapsulation layer 500. The protection layer 170 includes LiF.

As described above, according to an embodiment, the capping layer 160 extends not only over the display area DA but also into the peripheral area PA. Accordingly, the protection layer 170 extends beyond the capping layer 160 in the peripheral area PA such that the capping layer 160 and the encapsulation layer 500 do not directly contact each other. In this case, the protection layer 170 covers an end 160*a* of the capping layer 160 such that an end 170*a* of the protection layer 170 is on the planarization layer 140. In detail, as shown in FIG. 2, the end 170*a* of the protection layer 170 directly contacts the protection conductive layer 421, on the planarization layer 140.

Accordingly, according to an embodiment, the first inorganic encapsulation layer 510, which is the lowest of the encapsulation layers 500, does not contact the capping layer 160, but contacts the protection layer 170. Since the protection layer is formed of an inorganic material, such as LiF, unlike the capping layer, which is formed of an organic material, a bonding strength between the encapsulation layer 500 and a layer therebelow is high. Therefore, while the display apparatus 10 is being manufactured or being used, the encapsulation layer 500 is effectively prevented or minimized from being removed from the layer therebelow.

According to an embodiment, the encapsulation layer 500 is being formed, or in particular, when the organic encapsulation layer 520 is being formed, the material used to form the organic encapsulation layer 520 needs to be confined within a preset area. To this end, as shown in FIG. 2, the first confining dam 610 is located within the peripheral area PA. In detail, in addition to the gate insulating layer 120 and the interlayer insulating layer 130, the planarization layer 140 not only covers the display area DA of the substrate 100 but also extends into the peripheral area PA, as shown in FIG. 2. The first confining dam 610 is spaced, apart from the planarization layer 140 within the peripheral area PA.

According to an embodiment, the first confining dam 610 has a multi-layered structure. In other words, the first confining dam 610 includes a first layer 611 and a second layer 613 sequentially stacked in a direction above the substrate 100. The first layer 611 is simultaneously formed with the planarization layer 140 using the same material as that used to form the planarization layer 140, and the second layer 613 is simultaneously formed with the pixel defining layer 150 using the same material as that used to form the pixel defining layer 150.

As shown in FIG. 2, according to an embodiment, the second confining dam 620 is further included in addition to the first confining dam 610 and is located between the first confining dam 610 and the end 140*a* of the planarization layer 140. The second confining dam 620 is located on a portion of the protection conductive layer 421 that is disposed on the voltage line 420. Similar to the first confining dam 610, the second confining dam 620 is spaced apart from the planarization layer 140 in the peripheral area PA. The second confining dam 620 has a multi-layered structure like the first confining dam 610, and includes fewer layers than the first confining dam 610 to have a lower height than the first confining dam 610. In FIG. 2, the second confining dam 620 is simultaneously formed with the second layer 613 of the first confining dam 610 using the same material as that used to form the second layer 613.

Accordingly, according to an embodiment, the organic encapsulation layer 520 material is confined by the second confining dam 620, and thus the material used to form the organic encapsulation layer 520 can be prevented from overflowing beyond the second confining dam 620 while forming the organic encapsulation layer 520. Even when the material used to form the organic encapsulation layer 520 partially overflows the second confining dam 620, the organic encapsulation layer 520 material is further confined by the first confining dam 610, so that the organic encapsulation layer 520 material does not flow toward an edge 100*a* of the substrate 100. On the contrary, as shown in FIG. 2, the first and second inorganic encapsulation layers 510 and 530 cover the first and second confining dams 610 and 620 and extend beyond the first confining dam 610.

As shown in FIG. 2, according to an embodiment, a crack-prevention dam 630 is disposed in the peripheral area PA. The crack-prevention dam 630 extends along at least a portion of the edge 100*a* of the substrate 100. For example, the crack-prevention dam 630 surrounds the display area DA. In some sections, the crack-prevention dam 630 is discontinuous. The crack-prevention dam 630 prevents a crack from extending into the display area DA. The crack can be generated in the gate insulating layer 120 or the interlayer insulating layer 130, due to impacts when a mother substrate is cut off while manufacturing the display apparatus 10 or when using the display apparatus 10.

According to an embodiment, the crack-prevention dam 630 has various shapes. As shown in FIG. 2, the crack-prevention dam 630 is simultaneously formed with some of the components in the display area DA using the same material as that used to form this components, and has a multi-layered structure. In FIG. 2, the crack-prevention dam 630 has a multi-layered structure that includes a lower layer 630' and an upper layer 630" disposed on the lower layer 630'. In more detail, in FIG. 2, the crack-prevention dam 630 includes a lower layer 630' that includes the same material as that included in the gate insulating layer 120, and an upper layer 630" that includes the same material as that included in the interlayer insulating layer 130. When a buffer layer is formed on the substrate 100, this crack-prevention dam 630 further includes a layer that includes the same material as that included in the buffer layer. As shown in FIG. 2, a plurality of crack-prevention dams 630 are provided that are spaced apart from each other.

According to an embodiment, the crack-prevention dam 630 is formed by removing respective portions of the gate insulating layer 120 and the interlayer insulating layer 130. In other words, as shown in FIG. 2, a groove from which the gate insulating layer 120 and the interlayer insulating layer 130 have been removed is formed on at least one side of the crack-prevention dam 630, and the crack-prevention dam 630 is constituted by remaining portions of the gate insulating layer 120 and the interlayer insulating layer 130 that are adjacent to the groove.

According to an embodiment, the crack-prevention dam 630 is covered by a cover layer 650, as shown in FIG. 2. For example, the cover layer 650 is simultaneously formed with the planarization layer 140 in the display area DA using the same material as that used to form the planarization layer 140. In other words, the cover layer 650 includes an organic material that covers the crack-prevention dam 630, which includes an inorganic material. The cover layer 650 covers an end of the gate insulating layer 120 and the interlayer insulating layer 130 and also the crack-prevention dam 630.

Figure 3:
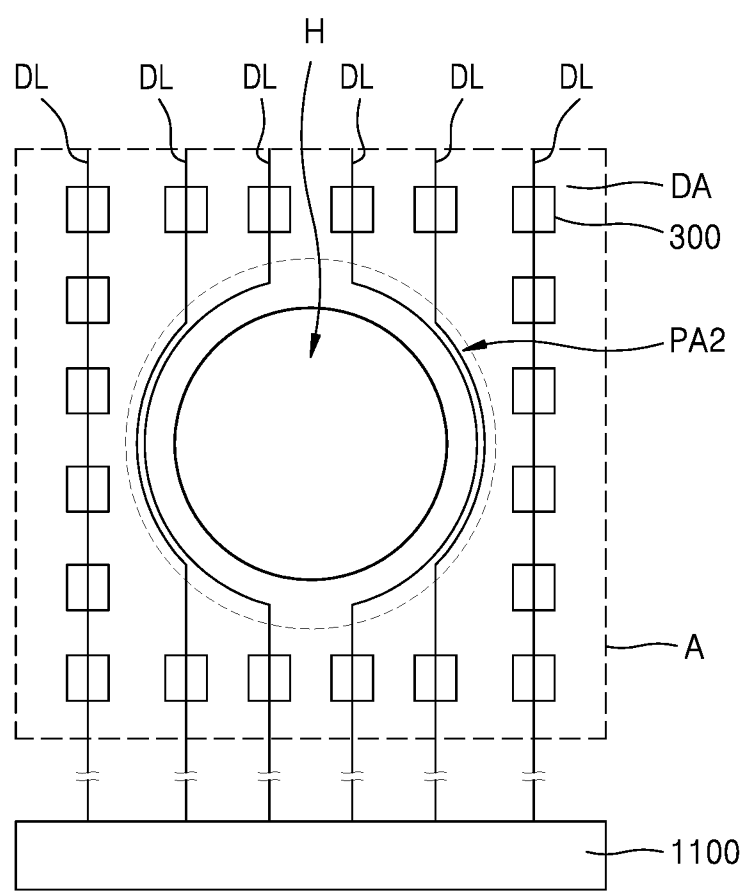
FIG. 3 is a magnified plan view, of a portion A of FIG. 1.
Figure 4:
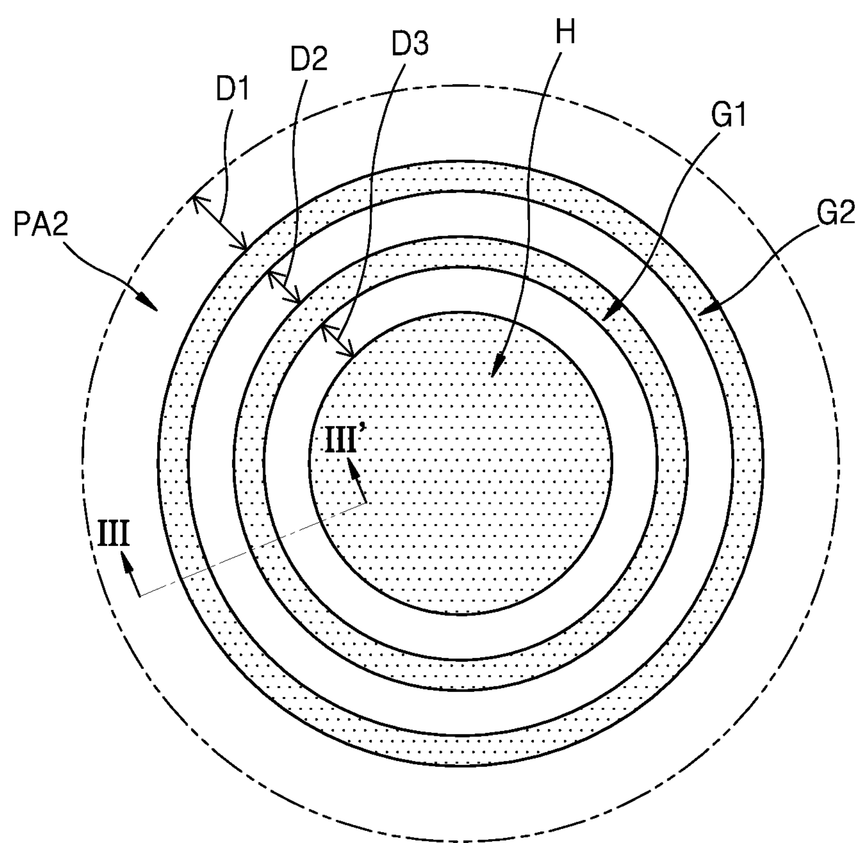
FIG. 4 is a schematic plan view of a through portion of FIG. 3, according to an embodiment.
Figure 5:
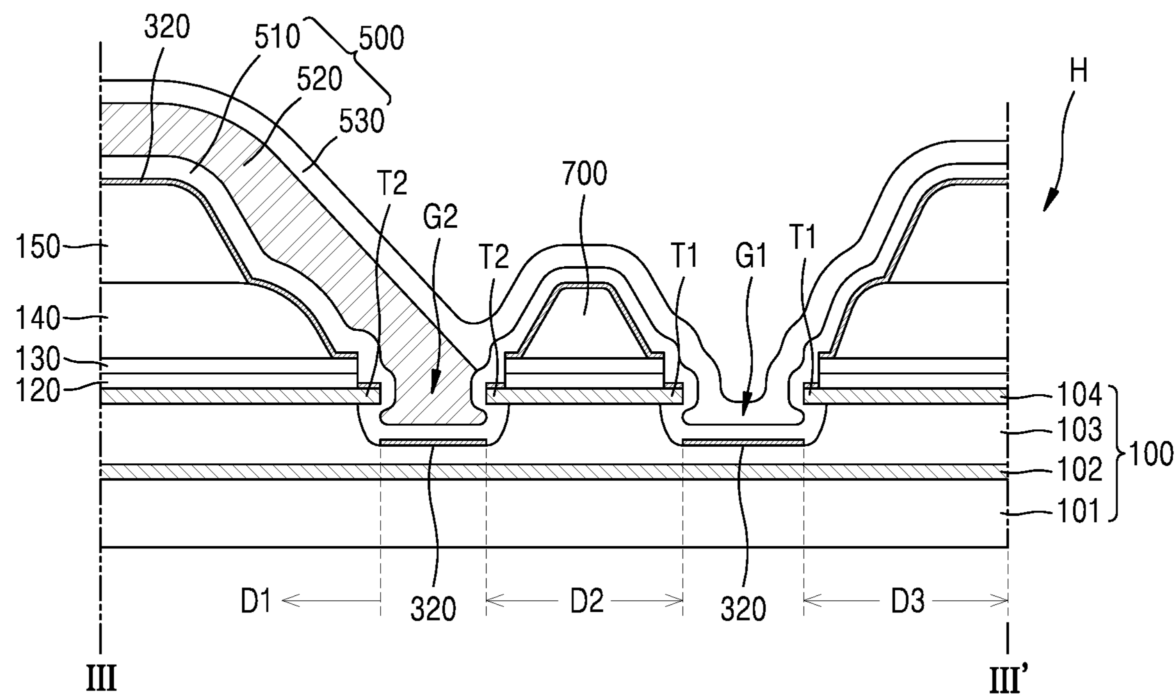
FIG. 5 is a cross-sectional view taken along line III-III' of FIG. 4, according to an embodiment.

According to an embodiment, FIG. 3 is a magnified plan view of a portion A of FIG. 1. FIG. 4 is a schematic plan view of a through portion H of FIG. 3, according to an embodiment. FIG. 5 is a cross-sectional view taken along line III-III' of FIG. 4, according to an embodiment.

According to an embodiment, FIG. 3 illustrates the through portion H and surroundings of the through portion H. Referring to FIG. 3, a plurality of OLEDs 300 electrically connected to data lines DL are disposed in the display area DA around the through portion H, and an area between the through portion H and the display area DA is a non-display area PA2 on which no image is displayed.

According to an embodiment, each of the data lines DL extends in a first direction and is electrically connected to a data driver 1100. For example, the data driver 1100 is a chip on panel (COP) type, and may be disposed in the peripheral area PA of FIG. 1 or disposed on a separate flexible printed circuit board (FPCB) that is electrically connected to a terminal in the peripheral area PA of FIG. 1.

According to an embodiment, some of the data lines DL that extend in the first direction are not straight, due to the through portion H in the display area DA. In this case, the some data lines DL are curved to detour around the through portion H, and the curved data lines DL detouring around the through portion H are located in the non-display area PA2 around the through portion H.

In addition, according to an embodiment, scan fines extend in a second direction that cross the data lines DL, and some of the scan lines are also curved to detour around the through portion H in the area in which the through portion H is formed. As another example, the display apparatus 10 of FIG. 1 includes two scan drivers disposed on both sides of the display area DA such that scan lines do not need to detour around the through portion H. In other words, scan lines electrically connected to OLEDs 300 on the left side of the through portion H, and scan lines electrically connected to OLEDs 300 on the right side of the through portion H are connected to different scan drivers.

Referring to FIGS. 4 and 5, according to an embodiment, which illustrate the through portion H in more detail, at least two grooves G1 and G2 that surround the through portion H are formed in the vicinity of the through portion H. The through portion H penetrates in a vertical direction the substrate 100 and a plurality of layers stacked on the substrate 100. Although a first groove G1 and a second groove G2 surround the through portion H in FIGS. 4 and 5, embodiments of the present disclosure are not limited thereto. In other words, three or more grooves may be formed. In the following description, two concentric grooves G1 and G2 are formed around through portion H and are referred to as the first groove G1 and the second groove G2 according to a radial distance from the through portion H. In other words, a groove that is closest to the through portion H is referred to as the first groove G1.

According to an embodiment, the first groove G1 surrounds the through portion H at a position spaced apart from the through portion H. The first groove G1 has an undercut structure. For example, the first groove G1 is formed by removing respective portions of the second barrier layer 104 and the second base layer 103 of the substrate 100. In this state, the second barrier layer 104 includes a pair of first tips T1 that face each other and extend toward each other in an upper end portion of the first groove G1.

According to an embodiment, after an opening is formed by patterning the second barrier layer 104, the second barrier layer 104 is as a mask while a laser beam is irradiated toward the second base layer 103 from above the second barrier layer 104 or dry etching is performed to remove the second base layer 103. In this way, the first groove G1 is formed, and accordingly portions of the second base layer 103 are removed to form a cavity that is wider than the opening of the second barrier layer 104. The width of the first groove G1 denotes a distance measured in a radial direction with respect to a center of the hole, perpendicular to a lengthwise direction of the first groove G1, For example, when the first groove G1 has a circular ring shape, the width of the first groove G1 is in a direction perpendicular to the circumferential direction of the circular ring.

In other words, according to an embodiment, a width of the upper end portion of the first groove G1 is less than a width of the interior of the bottom portion of the first groove G1, and the second barrier layer 104 includes a pair of first tips T1 that face each other, each having a cantilever shape in the upper end portion of the first groove G1.

According to an embodiment, because some of the plurality of layers that constitute the intermediate layer 320, such as functional layer(s), extend over the plurality of OLEDs 300 as described above, these layers are formed not only in the display area DA but also in the non-display area PA2. However, the intermediate layer 320 is not formed on an inner wall surface of the first groove G1 due to the undercut structure formed by the pair of first tips T1, and are only formed on a partial area of an upper surface of the bottom of the first groove G1. Accordingly, organic layers in the intermediate layer 320 are disconnected by the first groove G1, and thus external moisture or oxygen can be prevented from infiltrating into the display area DA from the through portion H along the organic layers in the intermediate layer 320.

According to an embodiment, the second groove G2 surrounds the first groove G1 while being spaced apart from the first groove G1. The configuration of the second groove G2 is substantially the same as that of the first groove G1. In other words, the second barrier layer 104 includes a pair of second tips T2 in an upper end portion of the second groove G2, and thus the second groove G2 has an undercut structure. Accordingly, when the intermediate layer 320 is formed, the organic layers in the intermediate layer 320 are disconnected by the second groove G2.

According to an embodiment, the non-display area. PA2 is divided into three regions D1, D2, and D3, namely, first, second, and third regions D1, D2, and D3, based on the first groove G1 and the second groove G2. The first region D1 is between the second groove G2 and the display area DA, and thus is an area between an end of a second tip T2 closest to the display area DA and the display area DA. Some of the data lines DL detouring around the through portion H are disposed in the first region D1. The second region D2 is between the first groove G1 and the second groove G2, and thus denotes an area between an end of a second tip T2 closest to the first groove G1 and a first tip T1 closest to the second groove G2. The third region D3 secures a cutting margin between an end of a first tip T1 closest to the through portion H and the through portion H, in a process of forming the through portion H.

According to an embodiment, the gate insulating layer 120 and the interlayer insulating layer 130 in the display area DA and in the peripheral region PA also extend into the first region D1, the second region D2, and the third region D3. In addition, the planarization layer 140 and the pixel defining layer 150 also extend into the first region D1 and the third region D3.

According to an embodiment, a flow-restriction portion 700 is disposed in the second region D2. The flow-restriction portion 700 protrudes upward from the substrate 100 in the second region D2. The gate insulating layer 120 and the interlayer insulating layer 130 are positioned between the flow-restricting portion 700 and the substrate 100. Accordingly, when the organic encapsulation layer 520 is formed, the flow-restriction portion 700 can prevent the organic encapsulation layer 520 material from flowing toward the first groove G1. When the organic encapsulation layer 520 material flows over the flow-restricting portion 700 toward the first groove G1, a refractive index of the flow-restriction portion 700 is changed by the overflowing organic encapsulation layer 520 material, and thus the overflow of the organic encapsulation layer 520 material can be easily ascertained. In this case, the flow-restriction portion 700 is simultaneously formed with the planarization layer 140 or the pixel defining layer 150 using the same material as that used to form the planarization layer 140 or the pixel defining layer 150. Alternatively, the flow-restriction portion 700 has a multi-layered stacked structure in which a lower layer includes the same material as that included in the planarization layer 140 and an upper layer includes the same material as that included in the pixel defining layer 150.

As described above, according to an embodiment, the intermediate layer 320 is not formed on the inner wall surfaces of the first and second grooves G1 and G2 due to the undercut structures of the first and second grooves G1 and G2, but the first inorganic encapsulation layer 510 of the encapsulation layer 500, which can be formed via chemical vapor deposition, is formed not only on the inner wall surfaces of the first and second grooves G1 and G2 but also on lower surfaces of the first and second tips T1 and T2. In other words, the first inorganic encapsulation layer 510 is continuously formed without being disconnected.

According to an embodiment, the organic encapsulation layer 520 fills an inside of the second groove G2, Accordingly, stress concentrated on the second tips T2 can be dispersed, and thus damage to the second tips 12 can be prevented. Consequently, damage to the first and second inorganic encapsulation layers 510 and 530 due to damage to the second tips T2 can be prevented.

Moreover, according to an embodiment, a location where the organic encapsulation layer 520 is formed is limited by the flow-restriction portion 700 in the second region D2, so that an increased amount of organic encapsulation layer 520 material can be contained in the second groove G2, and thus the organic encapsulation layer 520 can be formed to a sufficient thickness on the pixel defining layer 150. Therefore, even when stray particles are present on the pixel defining layer 150, they can be covered by the organic encapsulation layer 520 and the upper surface of the organic encapsulation layer 520 can be planarized. Accordingly, damage to the encapsulation layer 500 due to stray particles can be prevented. For example, the organic encapsulation layer 520 of the pixel defining layer 150 can be formed to have a thickness of 1 μm or more in the first region D1.

According to an embodiment, the second inorganic encapsulation layer 530 is formed similarly to the first inorganic encapsulation layer 510. Thus, the second inorganic encapsulation layer 530 and the first inorganic encapsulation layer 510 contact each other in the first groove G1 closest to the through portion H, and accordingly can effectively prevent infiltration of external moisture and oxygen.

Figure 6:
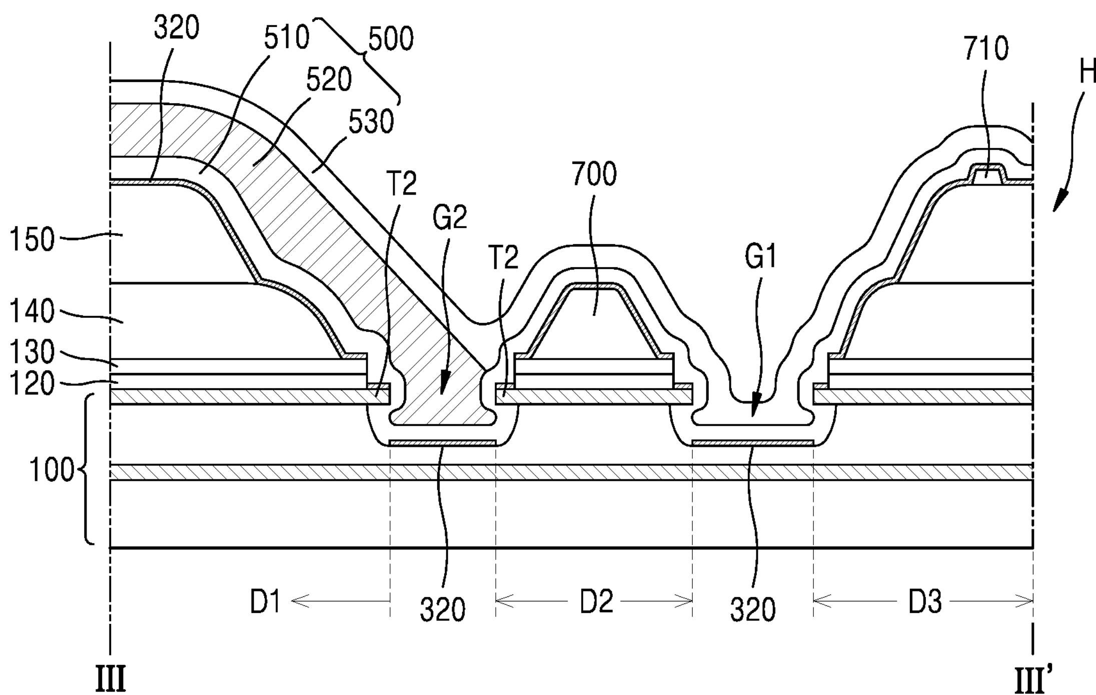
FIG. 6 is a cross-sectional view taken along line III-III' of FIG. 4, according to another embodiment.

FIG. 6 is a cross-sectional view taken along line III-III' of FIG. 4, according to another embodiment.

Referring to FIG. 6, according to an embodiment, the first groove G1 surrounds the through portion H at a location spaced apart from the through portion H, and the second groove G2 surrounds the first groove G1 at a location spaced apart from the first groove G1 By having an undercut structure, each of the first and second grooves G1 and G2 prevents the intermediate layer 320 from being continuously formed up to the through portion H, and thus can prevent external moisture or oxygen from infiltrating into the display area DA via the organic layers in the intermediate layer 320.

According to an embodiment, the gate insulating layer 120, the interlayer insulating layer 130, the planarization layer 140, and the pixel defining layer 150 stacked on the substrate 100 extend into the first region D1 and the third region D3. Since the flow-restriction portion 700 is disposed in the second region D2, the organic encapsulation layer 520 can be formed to a sufficient thickness on the pixel defining layer 150. Since the organic encapsulation layer 520 fills the inside of the second groove G2, the second tips T2 can be prevented from being damaged by stress.

According to an embodiment, the first and second inorganic encapsulation layers 510 and 530 extend past the first groove G1 toward the hole H, but the position of the organic encapsulation layer 520 is confined by the flow-restriction portion 700 formed in the second region D2. If the organic encapsulation layer 520 extended to the through portion H beyond the flow-restriction portion 700, external moisture or oxygen can infiltrate into the display area DA via the organic encapsulation layer 520. Accordingly, when the organic encapsulation layer 520 is formed, flow of the organic encapsulation layer 520 material toward the through portion H needs to be rapidly detected.

To this end, according to an embodiment, a first detection portion 710 is formed in the third region D3. In detail, the first detection portion 710 is disposed on the pixel defining layer 150 in the third region D3. For example, the first detection portion 710 is a protrusion that protrudes upwards from an upper surface of the pixel defining layer 150. The first detection portion 710 may be formed using the same material as that used to form the planarization layer 140 or the pixel defining layer 150, but embodiments of the present disclosure are not limited thereto. The first detection portion 710 may be formed continuously or discontinuously in a circumferential direction that surrounds the through portion H.

According to an embodiment, when the first detection portion 710 is disposed on the pixel defining layer 150 in the third region D3 as described above and the organic encapsulation layer 520 material has reached the third region D3 during formation of the organic encapsulation layer 520, a refractive index of the first detection portion 710 changes. Thus, it is easily and rapidly determined whether the organic encapsulation layer 520 material overflows. In other words, because a defect can be easily ascertained while manufacturing the display apparatus 10, a yield of the display apparatus 10 may improve.

Figure 7:
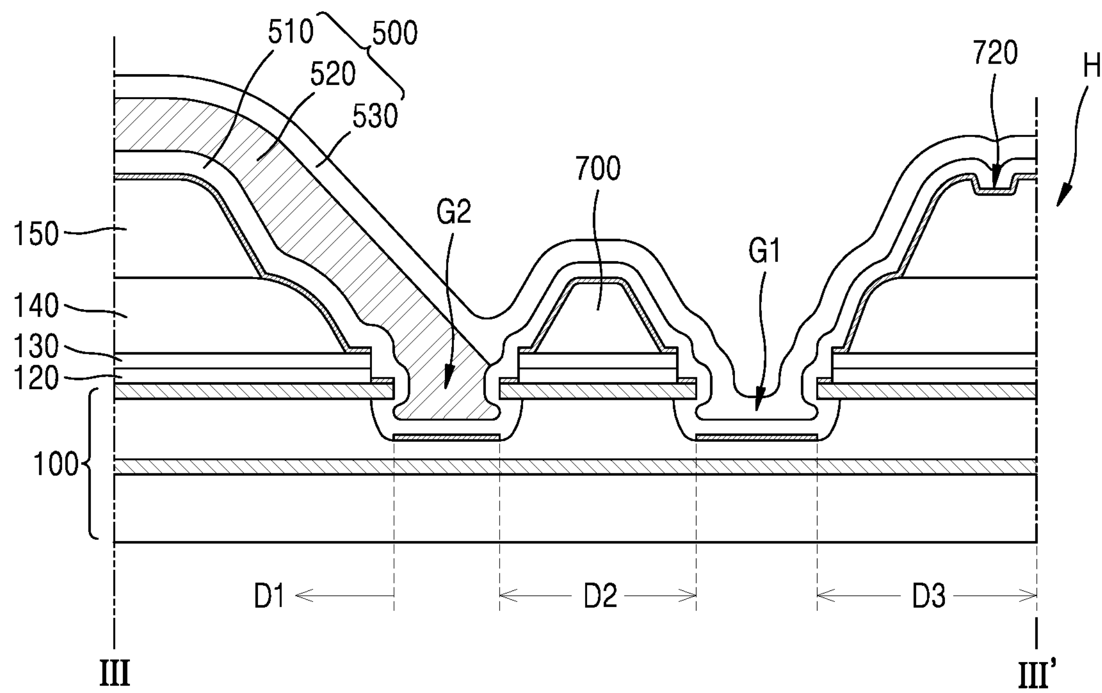
FIG. 7 is a cross-sectional view taken along line III-III' of FIG. 4, according to another embodiment.

FIG. 7 is a cross-sectional view taken along line III-III' of FIG. 4, according to another embodiment.

Referring to FIG. 7, according to an embodiment, the through portion H is surrounded by the first groove G1 and the second groove G2, and the gate insulating layer 120, the interlayer insulating layer 130, the planarization layer 140, and the pixel defining layer 150 are present in the first and third regions D1 and D3. The flow-restriction portion 700 is disposed in the second region D2.

According to an embodiment, the first and second inorganic encapsulation layers 510 and 530 extend beyond the first groove G1 toward the hole H, but position of the organic encapsulation layer 520 is confined by the flow-restriction portion 700 formed in the second region D2. The organic encapsulation layer 520 has a sufficient thickness on the pixel defining layer 150.

According to an embodiment, a second detection portion 720 is formed in the third region D3. For example, the second detection portion 720 has a concave shape that is indented from the upper surface of the pixel defining layer 150 in a depth direction of the pixel defining layer 150. The second detection portion 720 is formed continuously or discontinuously in a circumferential direction that surrounds the through portion H.

According to an embodiment, the concave shaped second detection portion 720 performs the same function as the first detection portion 710 of FIG. 6. In other words, when the organic encapsulation layer 520 material reaches the third region D3 and fills a concave portion of the second detection portion 720, a refractive index of the second detection portion 720 changes, and thus it is easily determined whether the organic encapsulation layer 520 material overflows. Accordingly, defect during the manufacture of the display apparatus 10 can be easily ascertained. The second detection portion 720, and the first detection portion 710 of FIG. 6 can be formed together in the third region D3, FIG. 8 is a cross-sectional view taken along line III-III' of FIG. 4, according to another embodiment.

Figure 8:
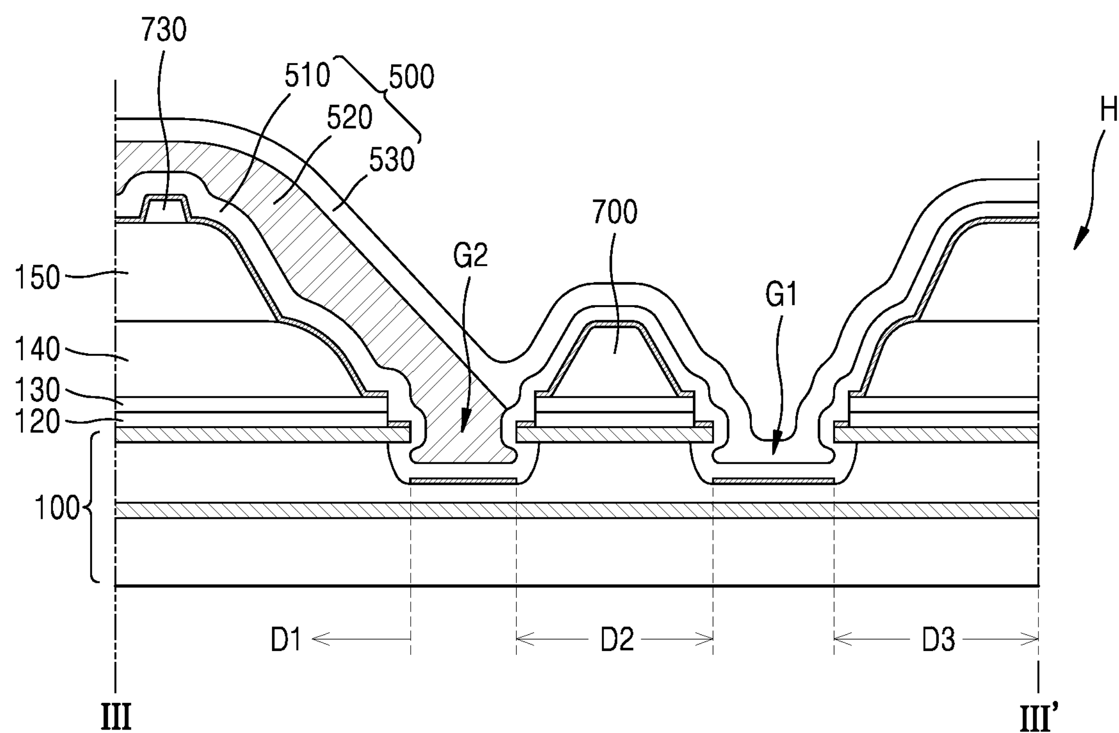
FIG. 8 is a cross-sectional view taken along line III-III' of FIG. 4, according to another embodiment.

Referring to FIG. 8, according to an embodiment, the flow-restriction portion 700 is disposed in the second region D2 between the first and second grooves G1 and G2 that surround the through portion H, and the gate insulating layer 120, the interlayer insulating layer 130, the planarization layer 140, and the pixel defining layer 150 are present in the first and third regions D1 and D3.

According to an embodiment, a third detection portion 730 is disposed located the first region D1. For example, the third detection portion 730 is a protrusion that protrudes upwards from the upper surface of the pixel defining layer 150, and is continuously formed to surround the through portion H. As another example, the third detection portion 730 is disconnected in a circumferential direction that surrounds the through portion H. The protrusion of the third detection portion 730 is simultaneously formed with the pixel defining layer 150. However, embodiments of the present disclosure are not limited thereto, and the third detection portion 730 may be formed on the pixel defining layer 150 via an additional process.

According to an embodiment, the third detection portion 730 can easily detect whether the organic encapsulation layer 520 material has coated the second groove G2 when the organic encapsulation layer 520 is formed. As described above, the organic encapsulation layer 520 needs to fill the second groove G2. To this end, the organic encapsulation layer 520 material needs to coat the outside of the pixel defining layer 150 of the first region D1. Accordingly, when changes in a refractive index of the third detection portion 730 due to being coated by the organic encapsulation layer 520 material are not detected, it may be determined that the coating of the organic encapsulation layer 520 material is defective.

Moreover, according to an embodiment, the third detection portion 730 can reduce a speed at which the organic encapsulation layer 520 material spreads from the pixel defining layer 150 in a direction toward the second groove G2, so that the organic encapsulation layer 520 is formed to have a thickness sufficient to cover stray particles on the pixel defining layer 150.

According to an embodiment, the first and second inorganic encapsulation layers 510 and 530 beyond the first groove G1 and contact each other, and accordingly can effectively prevent infiltration of external moisture and oxygen.

According to an embodiment, the first detection portion 710 of FIG. 6 or the second detection portion 720 of FIG. 7 may be formed in the third region D3, or the first detection portion 710 of FIG. 6 and the second detection portion 720 of FIG. 7 may be formed together.

Figure 9:
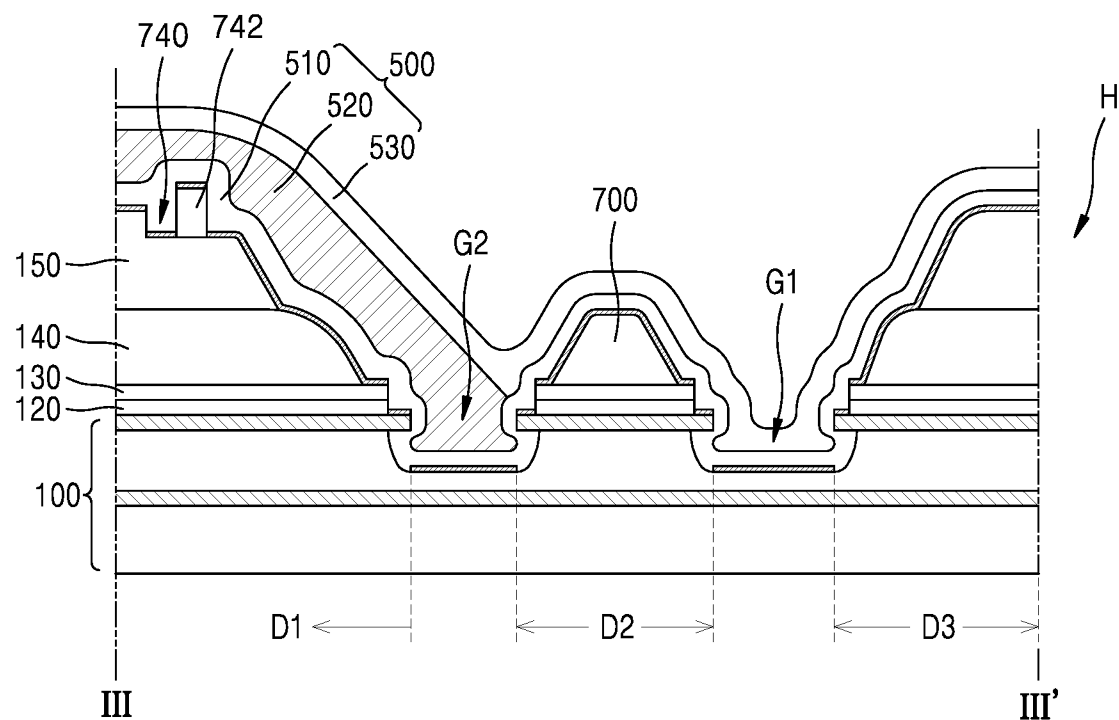
FIG. 9 is a cross-sectional view taken along line III-III' of FIG. 4, according to another embodiment.

FIG. 9 is a cross-sectional view taken along line III-III' of FIG. 4, according to an embodiment.

Referring to FIG. 9, according to an embodiment, the flow-restriction portion 700 is disposed in the second region D2 between the first and second grooves G1 and G2 that surround the through portion H, and the gate insulating layer 120, the interlayer insulating layer 130, the planarization layer 140, and the pixel defining layer 150 stacked on the substrate 100 are present in the first and third regions D1 and D3.

According to an embodiment, a fourth detection portion 742 is disposed the first region D1. The fourth detection portion 742 a shape similar to the third detection portion 730 of FIG. 8, but protrudes higher than the third detection portion 730 of FIG. 8. For example, a height of the fourth detection portion 742 is equal to a thickness of the pixel defining layer 150. However, when the fourth detection portion 742 protrudes higher than a spacer on the pixel defining layer 150, the fourth detection portion 742 can be, for example, damaged by a mask during the manufacture of the display apparatus 10. Accordingly, the fourth detection portion 742 is disposed on a stepped portion of the pixel defining layer 150. In detail, an end of the pixel defining layer 150 in the first region D1 is etched to have step shape that includes a stepped portion 740 that lowers the height of the pixel defining layer 150, and the fourth detection portion 742 is located on the stepped portion 740, and thus a final height of the fourth detection portion 742 is lowered.

According to an embodiment, the fourth detection portion 742, similar to the third detection portion 730 of FIG. 8, enables coating defects of the organic encapsulation layer 520 material to be easily ascertained, and reduces the speed at which the organic encapsulation layer 520 material flows from the end of the pixel defining layer 150 in the direction toward the second groove G2. Accordingly, the organic encapsulation layer 520 can be formed to have a sufficient thickness. The fourth detection portion 742 can be formed using a halftone mask simultaneously with the formation of the pixel defining layer 150.

According to an embodiment, the first detection portion 710 of FIG. 6 or the second detection portion 720 of FIG. 7 can be formed in the third region D3, or the first detection portion 710 of FIG. 6 and the second detection portion 720 of FIG. 7 can be formed together.

According to embodiments of the present disclosure, a display apparatus includes a through portion in which a separate member, such as a camera, is disposed, and at least two grooves that surround the through portion, thereby expanding a display area on which an image is displayed and also preventing infiltration of external moisture or oxygen via the through portion.

According to embodiments of the present disclosure, at least one flow restriction portion is disposed in the vicinity of the through portion to restrict an area where an organic encapsulation layer is formed during formation of the organic encapsulation layer, and flow of the organic encapsulation layer material toward the through portion can be easily detected.

Of course, embodiments of the present disclosure are not limited thereto.

It should be understood that exemplary embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate that includes a display area and a peripheral area outside the display area;

a thin film transistor disposed in the display area of the substrate;

a display device disposed in the display area that is electrically connected to the thin film transistor;

an encapsulation layer that protects the display device;

at least one through portion formed in the display area and that vertically penetrates the substrate and a plurality of layers stacked on the substrate; and a first groove and a second groove that are spaced apart from each other and that surround the at least one through portion, wherein the encapsulation layer comprises a first inorganic encapsulation layer, an organic encapsulation layer, and a second inorganic encapsulation layer sequentially stacked on each other, the first groove and the second groove partition a non-display area between the at least one through portion and the display area into a first region between the display area and the second groove, a second region between the first groove and the second groove, and a third region between the first groove and the at least one through portion, and a flow-restriction portion is disposed in the second region that protrudes upwards from the substrate that confines the organic encapsulation layer.

2. The display apparatus of claim 1, wherein the thin film transistor comprises a semiconductor layer a gate electrode, a source electrode, and a drain electrode, and the plurality of layers comprise a gate insulating layer disposed between the semiconductor layer and the gate electrode, an interlayer insulating layer disposed between the gate electrode and the source and drain electrodes, a planarization layer on the thin film transistor, and a pixel defining layer disposed on the planarization layer that exposes a center portion of a pixel electrode of the display device, wherein the plurality of layers are disposed within the first region and the third region.

3. The display apparatus of claim 2, wherein the flow-restriction portion comprises a same material as a material included in at least one of the planarization layer and the pixel defining layer.

4. The display apparatus of claim 2, further comprising a first detection portion disposed on the pixel defining layer in the third region that protrudes upwards from an upper surface of the pixel defining layer.

5. The display apparatus of claim 2, further comprising a second detection portion formed in an upper surface of the pixel defining layer in the third region, wherein the second detection portion has a concave shape indented in a thickness direction of the pixel defining layer.

6. The display apparatus of claim 2, further comprising a third detection portion disposed on the pixel defining layer in the first region that protrudes upwards from an upper surface of the pixel defining layer.

7. The display apparatus of claim 2, further comprising:

a stepped portion formed in an end of the pixel defining layer in the first region that lowers a height of the pixel defining layer, and a fourth detection portion disposed on the stepped portion that protrudes upwards from the pixel defining layer.

8. The display apparatus of claim 2, wherein the gate insulating layer and the interlayer insulating layer are disposed in the second region between the substrate and the flow-restriction portion.

9. The display apparatus of claim 1, wherein the organic encapsulation layer fills an inside of the second groove, and the first inorganic encapsulation layer and the second inorganic encapsulation layer contact each other in the first groove.

10. The display apparatus of claim 1, wherein the substrate comprises a first base layer, a first barrier layer, a second base layer, and a second barrier layer sequentially stacked on each other, each of the first groove and the second groove extends from the second barrier layer into a portion of the second base layer, and a width of an upper portion of the first groove is less than a width of the inside of the first groove, and a width of an upper portion of the second groove is less than a width of an inside of the second groove.

11. A display apparatus, the display apparatus comprising:

a display area and a peripheral area outside the display area;

a substrate that includes a first base layer, a first barrier layer, a second base layer, and a second barrier layer sequentially stacked on each other;

a display device disposed on the second barrier layer in the display area;

an encapsulation layer disposed on the display device and that protects the display device and extends from the display area into the peripheral area;

a through portion formed in the display area that penetrates the display device in a thickness direction of the display device;

a first groove that surrounds the through portion at a position spaced apart from the through portion;

a second groove spaced apart from the first groove and that surrounds the first groove; and a flow-restriction portion disposed between the first groove and the second groove that protrudes upwards from the substrate, wherein each of the first groove and the second groove penetrates the second barrier layer into a portion of the second base layer, and the second groove is filled by an organic encapsulation layer of the encapsulation layer.

12. The display apparatus of claim 11, wherein the display device comprises a pixel electrode, an opposite electrode, and an intermediate layer between the pixel electrode and the opposite electrode and that includes an emission layer, the display apparatus further comprises a thin film transistor that is electrically connected to the pixel electrode, a planarization layer disposed between the thin film transistor and the display device, and a pixel defining layer disposed on the planarization layer and that exposes a center portion of the pixel electrode, and the planarization layer and the pixel defining layer are disposed in a region between the through portion and the first groove and also in a region between the second groove and the display area.

13. The display apparatus of claim 12, wherein the flow-restriction portion comprises a same material as a material included in at least one of the planarization layer and the pixel defining layer.

14. The display apparatus of claim 12, further comprising a first detection portion disposed on the pixel defining layer in the region between the through portion and the first groove, wherein first detection portion protrudes upwards from an upper surface of the pixel defining layer.

15. The display apparatus of claim 12, further comprising a second detection portion formed on an upper surface of the pixel defining layer in the region between the through portion and the first groove, wherein the second detection portion has a concave shape indented in a thickness direction of the pixel defining layer.

16. The display apparatus of claim 12, further comprising a third detection portion disposed on the pixel defining layer in the region between the second groove and the display area, wherein the third detection portion protrudes upwards from an upper surface of the pixel defining layer.

17. The display apparatus of claim 12, further comprising a stepped portion formed at an end of the pixel defining layer in the region between the second groove and the display area, wherein the stepped portion lowers a height of the pixel defining layer, and a fourth detection portion disposed on the stepped portion and that protrudes upwards from the pixel defining layer.

18. The display apparatus of claim 11, wherein the encapsulation layer further comprises a first inorganic encapsulation layer and a second inorganic encapsulation layer respectively disposed on a lower surface and an upper surface of the organic encapsulation layer, and the first inorganic encapsulation layer and the second inorganic encapsulation layer contact each other in the first groove.

19. The display apparatus of claim 11, wherein the second barrier layer comprises a pair of cantilever shaped first tips that face each other in an upper end portion of the first groove, and a pair of cantilever shaped second tips that face each other in an upper end portion of the second groove.

20. A display apparatus, the display apparatus comprising:

a substrate that includes a first base layer, a first barrier layer, a second base layer, and a second barrier layer sequentially stacked on each other, wherein the substrate includes a display area and a peripheral area outside the display area;

an encapsulation layer disposed on the substrate that extends from the display area into the peripheral area, wherein the encapsulation layer includes a first inorganic encapsulation layer, an organic encapsulation layer, and a second inorganic encapsulation layer sequentially stacked on each other;

a through portion formed in the display area of the substrate that penetrates the substrate in a thickness direction of the substrate;

a first groove that surrounds the through portion at a position spaced apart from the through portion;

a second groove spaced apart from the first groove and that surrounds the first groove; and a flow-restriction portion disposed between the first groove and the second groove that protrudes upwards from the substrate, wherein each of the first groove and the second groove penetrates the second barrier layer into a portion of the second base layer, the first inorganic encapsulation layer and the second inorganic encapsulation layer contact each other in the first groove, and the second groove is filled by the organic encapsulation layer.

* * * * *